(12) United States Patent
Hooker et al.

(10) Patent No.: US 9,646,892 B2
(45) Date of Patent: *May 9, 2017

(54) TRANSISTOR DEVICE AND A METHOD OF MANUFACTURING SAME

(71) Applicant: TAIWAN SEMICONDUCTOR MANUFACTURING COMPANY, LTD., Hsin-Chu (TW)

(72) Inventors: Jacob C. Hooker, Hamburg (DE); Markus Mueller, Brussels (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/847,333

(22) Filed: Sep. 8, 2015

(65) Prior Publication Data

US 2016/0005737 A1    Jan. 7, 2016

Related U.S. Application Data

(63) Continuation of application No. 14/061,078, filed on Oct. 23, 2013, now Pat. No. 9,153,584, which is a (Continued)

(30) Foreign Application Priority Data

Jun. 9, 2008  (EP) ..................... 08104342

(51) Int. Cl.
*H01L 21/8238* (2006.01)
*H01L 27/092* (2006.01)
(Continued)

(52) U.S. Cl.
CPC ............. *H01L 21/823828* (2013.01); *H01L 21/02178* (2013.01); *H01L 21/02181* (2013.01);
(Continued)

(58) Field of Classification Search
None
See application file for complete search history.

(56) References Cited

U.S. PATENT DOCUMENTS 6,432,781 B2    8/2002  Wasshuber
6,458,695 B1   10/2002  Lin et al.
(Continued)

OTHER PUBLICATIONS

C. R. Helms and B.E. Deal, "Mechanisms of the HF/H2O vapor phase etching of SiO2", Jul./Aug. 1992, pp. 806-811, J. Vac. Sci. Technol. A 10(4).

*Primary Examiner* — Fei Fei Yeung Lopez
(74) *Attorney, Agent, or Firm* — Haynes and Boone, LLP (57) ABSTRACT

A transistor device is provided that includes a substrate, a first channel region formed in a first portion of the substrate and being doped with a dopant of a first type of conductivity, a second channel region formed in a second portion of the substrate and being doped with a dopant of a second type of conductivity, a gate insulating layer formed on the first channel region and on the second channel region, a dielectric capping layer formed on the gate insulating layer, a first gate region formed on the dielectric capping layer over the first channel region, and a second gate region formed on the dielectric capping layer over the second channel region, wherein the first gate region and the second gate region are made of the same material, and wherein one of the first gate region and the second gate region comprises an ion implantation.

20 Claims, 3 Drawing Sheets

Related U.S. Application Data continuation of application No. 12/477,809, filed on Jun. 3, 2009, now Pat. No. 8,592,922.

(51) Int. Cl.

| | |
|---|---|
| *H01L 21/28* | (2006.01) |
| *H01L 21/8234* | (2006.01) |
| *H01L 21/02* | (2006.01) |
| *H01L 21/265* | (2006.01) |
| *H01L 21/3215* | (2006.01) |
| *H01L 29/49* | (2006.01) |
| *H01L 29/51* | (2006.01) |

(52) U.S. Cl.
CPC ...... *H01L 21/02192* (2013.01); *H01L 21/265* (2013.01); *H01L 21/28185* (2013.01); *H01L 21/3215* (2013.01); *H01L 21/8238* (2013.01); *H01L 21/823462* (2013.01); *H01L 21/823842* (2013.01); *H01L 21/823857* (2013.01); *H01L 27/092* (2013.01); *H01L 27/0922* (2013.01); *H01L 27/0928* (2013.01); *H01L 29/49* (2013.01); *H01L 29/517* (2013.01)

(56) References Cited

U.S. PATENT DOCUMENTS

| | | | |
|---|---|---|---|
| 6,573,160 B2 | 6/2003 | Taylor et al. | |
| 6,914,312 B2 | 7/2005 | Nishikawa et al. | |
| 7,005,716 B2 | 2/2006 | Lin et al. | |
| 7,081,409 B2 | 7/2006 | Kang et al. | |
| 7,375,403 B2 | 5/2008 | Kaneko et al. | |
| 7,378,713 B2 | 5/2008 | Hsu et al. | |
| 7,429,776 B2 | 9/2008 | Koyama et al. | |
| 7,504,329 B2 | 3/2009 | Yu et al. | |
| 7,598,545 B2 | 10/2009 | Cartier et al. | |
| 7,807,990 B2 | 10/2010 | Koyama et al. | |
| 7,880,242 B2 | 2/2011 | Lee | |
| 8,592,922 B2 * | 11/2013 | Hooker | H01L 21/823842 257/204 |
| 9,153,584 B2 * | 10/2015 | Hooker | H01L 21/823842 |
| 2003/0104663 A1 * | 6/2003 | Visokay | H01L 21/823842 438/199 |
| 2004/0023478 A1 * | 2/2004 | Samavedam | H01L 21/823814 438/592 |
| 2004/0256679 A1 | 12/2004 | Hu | |
| 2005/0098839 A1 | 5/2005 | Lee et al. | |
| 2006/0093833 A1 | 5/2006 | Meyer et al. | |
| 2006/0289903 A1 | 12/2006 | Andreoni et al. | |
| 2008/0128822 A1 * | 6/2008 | Koyama | H01L 21/823857 257/369 |
| 2009/0072312 A1 | 3/2009 | Chang et al. | |
| 2009/0108294 A1 | 4/2009 | Choi et al. | |
| 2009/0152636 A1 | 6/2009 | Chudzik et al. | |

* cited by examiner

TRANSISTOR DEVICE AND A METHOD OF MANUFACTURING SAME

CROSS REFERENCE

This application is a continuation of U.S. application Ser. No. 14/061,078 filed Oct. 23, 2013, and entitled "A Transistor Device and Method of Manufacturing Same," which is a continuation of U.S. application Ser. No. 12/477,809 filed Jun. 3, 2009, and entitled "A Transistor Device and a Method of Manufacturing Same," issued as U.S. Pat. No. 8,592,922, which claims priority to European patent application number 08104324.2, filed Jun. 9, 2008, the entire disclosures of which are all incorporated herein by reference in their entirety.

FIELD OF THE INVENTION

The invention relates to a transistor device. Moreover, the invention relates to a method of manufacturing a transistor device.

BACKGROUND OF THE INVENTION

In semiconductor technology, the efficient manufacture of field effect transistors is essential. For modern applications, the demands on the quality and on the performance of transistors increases.

U.S. Pat. No. 6,458,695 discloses methods for forming dual-metal gate CMOS transistors. An n-MOS and a p-MOS active area of a semiconductor substrate are separated by isolation regions. A metal layer is deposited over a gate dielectric layer in each active area. Oxygen ions are implanted into the metal layer in one active area to form an implanted metal layer which is oxidized to form a metal oxide layer. Thereafter, the metal layer and the metal oxide layer are patterned to form a metal gate in one active area and a metal oxide gate in the other active area wherein the active area having the gate with the higher work function is the p-MOS active area. Alternatively, both gates may be metal oxide gates wherein the oxide concentrations of the two gates differ. Alternatively, a dummy gate may be formed in each of the active areas and covered with a dielectric layer. The dielectric layer is planarized thereby exposing the dummy gates. The dummy gates are removed leaving gate openings to the semiconductor substrate. A metal layer is deposited over a gate dielectric layer within the gate openings to form metal gates. One or both of the gates are oxygen implanted and oxidized. The p-MOS gate has the higher work function.

However, it may be difficult to adjust work functions of transistors in a simple manner in conventional transistor manufacture procedures.

OBJECT AND SUMMARY

It is an object of the invention to provide a transistor architecture which allows a flexible adjustment of a work function of a transistor and which is simple in manufacture.

In order to achieve the object defined above, a transistor device and a method of manufacturing a transistor device according to the independent claims are provided.

According to an exemplary embodiment of the invention, a transistor device is provided comprising a substrate (such as a semiconductor substrate), a first channel region formed in a first portion (for instance in a first surface portion) of the substrate and being doped with a dopant of a first type of conductivity (for instance n-doped or p-doped), a second channel region formed in a second portion (for instance in a second surface portion) of the substrate and being doped with a dopant of a second type of conductivity (for instance p-doped or n-doped), a gate insulating layer (for instance a consecutive or continuous layer or a number of separate dielectric islands) formed on (for instance directly over) the first channel region and on the second channel region, a dielectric capping layer formed on (for instance directly over) the gate insulating layer, a first gate region formed on (for instance directly over) the dielectric capping layer over the first channel region, and a second gate region formed on (for instance directly over) the dielectric capping layer over the second channel region, wherein the first gate region and the second gate region are made of the same material and wherein one (for instance exactly one) of the first gate region and the second gate region comprises an ion implantation (for instance for the purpose of adjusting a work function of the corresponding transistor).

According to another exemplary embodiment of the invention, a method of manufacturing a transistor device is provided, wherein the method comprises doping a first portion of a substrate with a dopant of a first type of conductivity to thereby form a first channel region in the first portion of the substrate, doping a second portion of the substrate with a dopant of a second type of conductivity to thereby form a second channel region in the second portion of the substrate, forming a gate insulating layer on the first channel region and on the second channel region, forming a dielectric capping layer on the gate insulating layer, forming a first gate region on the dielectric capping layer over the first channel region, and forming a second gate region on the dielectric capping layer over the second channel region, wherein the first gate region and the second gate region are made of the same material, and wherein one of the first gate region and the second gate region comprises an ion implantation.

The term "field effect transistor" (FET) may denote a transistor in which an output current (source-drain current) may be controlled by the voltage applied to a gate which can be a MOS structure (MOSFET). Such a field effect transistor may be part of a monolithically integrated circuit and may provide a function such as a memory function, a logic function, a switch function and/or an amplifier function.

The term "substrate" may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip. According to an exemplary embodiment, a monocrystalline substrate may be employed.

The term "layer" may particularly denote any physical structure formed by a specific material or material combination and being shaped in a planar or non-planar manner. Different portions of a patterned or non-patterned layer may be connected to one another or may form different non-connected island-like sections.

The term "source/drain region" may particularly denote a source region or a drain region. Since the functionality of a source region and a drain region may depend on the operation mode of a transistor, for instance voltages applied thereto, the term source/drain region may denote a structure which can act as a source region or as a drain region.

The term "well structure" may particularly denote a doped surface portion of a substrate. A well structure may include a channel region.

The term "gate structure" may denote an electrically conductive structure to which an electric voltage may be applied to control a conductivity of a channel region of a semiconductor substrate/well.

The term "gate insulating structure" may denote an electrically insulating structure which prevents a direct ohmic connection between gate and channel, thereby contributing to the field effect. For instance, the gate insulating structure may be a layer of silicon oxide having a homogeneous thickness.

The term "type of conductivity" may denote that current is carried by positive or negative mobile charge carriers. One type of conductivity is therefore current carried by positively charged charge carriers, another type of conductivity is therefore current carried by negatively charged charge carriers. Conduction by p-type charge carriers may be denoted as a complementary conduction mechanism as compared to conduction by n-type charge carriers.

According to an exemplary embodiment of the invention, a transistor device with a complementary arrangement of individual transistors of opposite doping characteristics may be provided which allows to independently adjust the work functions of transistors of both kinds of conductivity particularly by a combination of two measures. Firstly, in addition to a gate insulating layer, a separate dielectric capping layer is provided which can be adjusted regarding material selection, thickness, etc. for the purpose of work function adjustment. Secondly, both types transistors (p-type, n-type) can be manufactured from the same gate material, wherein different work functions of different transistors may be adjusted by selectively performing an ion implantation in exactly one of the two gate regions and/or by performing ion implantations in the two different gate regions in a different manner. Thus, with a very simple manufacturing process involving a small number of masks, materials and procedural steps, it is possible to precisely adjust work functions such as threshold voltage in a CMOS architecture.

In the following, further exemplary embodiments of the transistor device will be explained. However, these embodiments also apply to the method.

The first type of conductivity may be complementary or inverse to the second type of conductivity. For example, the first transistor may be a transistor of the n-type of conductivity, whereas the second transistor may be a transistor of the p-type of conductivity. Therefore, a combination of n-MOS and p-MOS transistors may be manufactured with low effort and with selectively and independently adjustable work functions.

In another embodiment, the first type of conductivity may be the same as the second type of conductivity. In other words, it is possible that both the first and the second type of conductivity are n-type (for instance one is $n^+$-doped and the other one is n-doped) or that both the first and the second type of conductivity are p-type (for instance one is $p^+$-doped and the other one is p-doped). In a scenario in which both the first and the second type of conductivity are of the same dopant type, it is possible that the dopant concentration in the first channel region differs from the dopant concentration in the second channel region.

Particularly, the first channel region, a first part of the gate insulating layer, a first part of the dielectric capping layer and a first gate region may be part of a first field effect transistor of a first type of conductivity, for instance may be part of an n-MOS transistor. The second channel region, a second part of the gate insulating layer, a second part of the dielectric capping layer and the second gate region may be part of a second field effect transistor of a second type of conductivity, for instance may be a p-MOS. Thus, CMOS circuits may be formed with reasonable effort allowing to adjust different work functions for both transistor types.

The dielectric capping layer may comprise a high-k material. The term high-k dielectric may refer to a material with a higher dielectric constant as compared to silicon oxide ($SiO_2$) used in semiconductor manufacturing processes and which is provided in addition to the silicon oxide gate dielectric. The implementation of a high-k capping layer allows to further miniaturizing the microelectronic components such as field effect transistor arrangements, since a high-k layer allows obtaining a sufficiently high gate capacitance without undesired leakage effects. Examples for high-k materials are aluminium oxide, tantalum oxide, hafnium oxide, zirconium oxide or raw earth oxides.

Particularly, the dielectric capping layer may comprise or consist of a rare earth oxide, for instance may comprise dysprosium oxide ($Dy_2O_3$), lanthanum oxide ($La_2O_3$) or scandium oxide ($Sc_2O_3$). The rare earth materials may be denoted as the chemical elements having a partially filled 4f shell. They may be chemically compatible with silicon technology and may further allow to properly adjust transistor characteristics.

Alternatively, the dielectric capping layer may comprise a group III metal oxide such as aluminium oxide ($Al_2O_3$). Also these materials have a sufficiently high-k value, are chemically compatible with silicon technology and allow to properly adjust transistor properties such as threshold voltage and/or leaking characteristics.

The first gate region and the second gate region may be made of the same metallic material. The first gate region and the second gate region may be formed on the basis of a metal layer deposited or formed in a common procedure thereby allowing to significantly simplifying the manufacturing procedure. Examples for suitable materials for the gate regions are titan, tantalum, molybdenum, or tungsten. More generally, Mo, MoN, MoO, TaC, TaN, TaSi, TiN, $TiSi_2$, TiSiN, TiAlN, W, WN including also non-stoichiometric alloys may be used as materials for the gate regions.

In an embodiment, one of the first gate region and the second gate region comprises an ion implantation (and comprises therefore a metal comprising implanted ions), whereas the other one of the two gate regions is free of an ion implantation (and comprises therefore a pure metal). Thus, with a single ion implantation procedure in combination with a proper masking of one of the gate regions during ion implantation, it is possible to adjust different working functions for the complementary transistors. Alternatively, two different ion implantations (regarding material and/or implantation rate) may be used for the two gate regions to distinguish the transistor properties of the complementary transistors from one another.

Exemplary materials for the ion implantation for adjusting a work function are materials such as aluminium (Al), arsenic (As), boron (B), germanium (Ge), phosphorous (P), silicon (Si), ytterbium (Yb) or yttrium (Y). Not only the kind of material but also the concentration of the implanted ions within the metal gate portion may be used as a design parameter for setting a transistor characteristic.

A thickness of the dielectric capping layer may be less than basically 5 nm, particularly may be less than basically 2 nm. Thus, the topography of the manufactured device may be kept sufficiently small and the field effect may be probably intermediated via the capping layer, in combination with the gate dielectric layer, which may be provided separately from the dielectric capping layer. The gate dielectric layer may be made of a different material as compared to the dielectric capping layer.

The gate insulating layer itself may also comprise a high-k material, alternatively silicon oxide or silicon oxide nitride (SiON). It may be manufactured by depositing a layer on the doped wells of the substrate. Alternatively, it may be manufactured by thermally oxidizing a silicon surface of a silicon substrate.

The one of the first gate region and the second gate region which comprises the ion implantation may relate to an n-type field effect transistor. It has turned out to be particularly appropriate to manipulate an n-MOSFET characteristic by performing an ion implantation of its gate.

Embodiments of the invention combine the use of dielectric capping layers such as $Al_2O_3$ or $Dy_2O_3$ with an ion implantation into a metal gate portion to tune the work function of the gate stack and to provide a custom-designed CMOS system for the purpose of work function tuning. This may be supported by the use of dielectric capping layers. It is possible to use layered gate oxide stacks for work function tuning in combination with ion implantation.

In an embodiment, a CMOS integration scheme may be provided comprising a p-channel, an n-channel, a dielectric layer provided over the p-channel and the n-channel, a capping layer of aluminium oxide or a rare earth oxide disposed over or under (the possibility of depositing this "capping" dielectric below the "host" dielectric layer is a possible alternative) the dielectric layer, and a single metal gate disposed over the capping layer, wherein either the n-MOS or the p-MOS region of the metal gate is ion implanted. Thus, in one embodiment, the dielectric capping layer may be arranged between the gate insulating layer and the channel. In another embodiment, the gate insulating layer may be arranged between the dielectric capping layer and the channel.

An embodiment relates to an integration scheme for CMOS circuits that allows the same metal to be used as the gate material for n-MOS and p-MOS devices. A corresponding structure may comprises a gate dielectric, such as silicon oxide, which is overlaid or underlaid with a dielectric cap of a high-k dielectric. In particular, the high-k dielectric cap may be aluminium oxide or a rare earth oxide such as dysprosium oxide. The gates of the n-MOS and p-MOS devices may be formed of the same metal. However, the work function of one of the gates may be changed by implanting ions into the metal layer in one region (for instance n-MOS) while masking the metal in the other region (for instance p-MOS). This may allow to provide CMOS structures comprising gates made of the same basic metallic material where the work function of at least one of the gates is altered by ion implantation.

The substrate may be a semiconductor substrate. The transistor device may be monolithically integrated in the semiconductor substrate, particularly comprising one of the group consisting of a group IV semiconductor (such as silicon or germanium), or of a group III-group V semiconductor (such as gallium arsenide).

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), oxidation or sputtering. Removing layers or components may include etching techniques like wet etching, plasma etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The transistors may be formed on a purely crystalline silicon wafer or on a wafer consisting out of a semiconductor film on a buried oxide on substrate (such as SOI (Silicon On Insulator), GeOI, etc.).

Any process technologies like CMOS, BIPOLAR, BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

The illustration in the drawing is schematical. In different drawings, similar or identical elements are provided with the same reference signs.

In the following, referring to FIG. 1 to FIG. 6, a method of manufacturing a transistor device according to an exemplary embodiment of the invention will be explained in detail.

Figure 1:
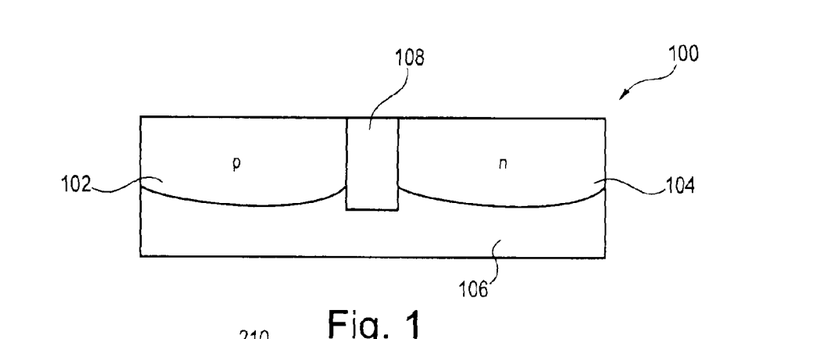
FIG. 1 to FIG. 6 show different layer sequences obtained during carrying out a method of manufacturing a CMOS arrangement according to an exemplary embodiment of the invention.

FIG. 1 shows a semiconductor layer sequence 100.

A p-well 102 and an n-well 104 are formed in different surface portions of a crystalline silicon substrate 106. Furthermore, a shallow trench insulation 108 made of silicon oxide is formed in the substrate 106 to separate two complementary transistor portions of the transistor device to be manufactured.

Figure 2:
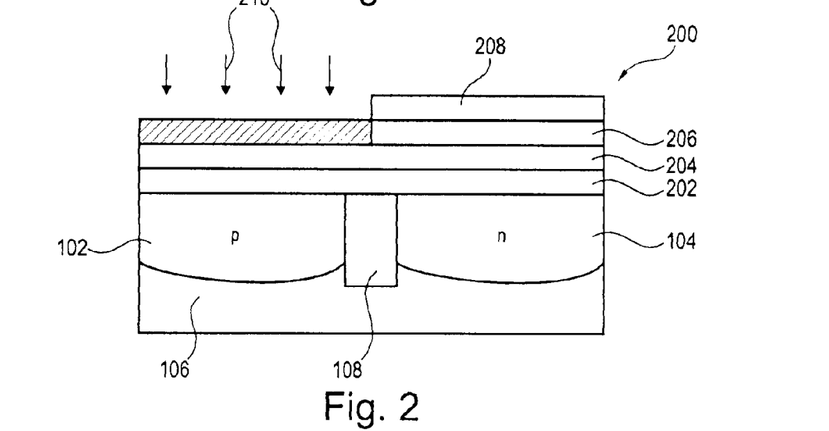

In order to obtain a layer sequence 200 shown in FIG. 2, a silicon oxide or high-k gate dielectric layer 202, an aluminium oxide layer 204 and a tungsten (alternatively titanium nitride) layer 206 are deposited one after the other by conformal deposition on the layer sequence 100 shown in FIG. 1.

Alternatively, a thin poly-Si layer (5 nm to 30 nm) may be deposited on the metal, in order to avoid adhesion problems of the resist on metal and contamination issues.

Subsequently, a first photoresist layer 208 is deposited and patterned on top of the tungsten layer 206 to expose only a portion of the tungsten layer 206 vertically above the p-well 102. After that, an ion implantation with arsenic ions, schematically indicated with reference numeral 210, is performed. Due to the previous patterning of the photoresist 208, only the portion of the tungsten layer 206 above the p-well 102 is ion implanted, whereas the portion of the tungsten layer 206 above the n-well 104 is prevented from an ion implantation. This allows to use a single metal for forming gate regions of two complementary transistors and to simultaneously realize different work functions for both transistors.

In another embodiment, the metal may be capped by poly-Si (50 nm to 100 nm) before putting the resist for gate etch.

Figure 3:
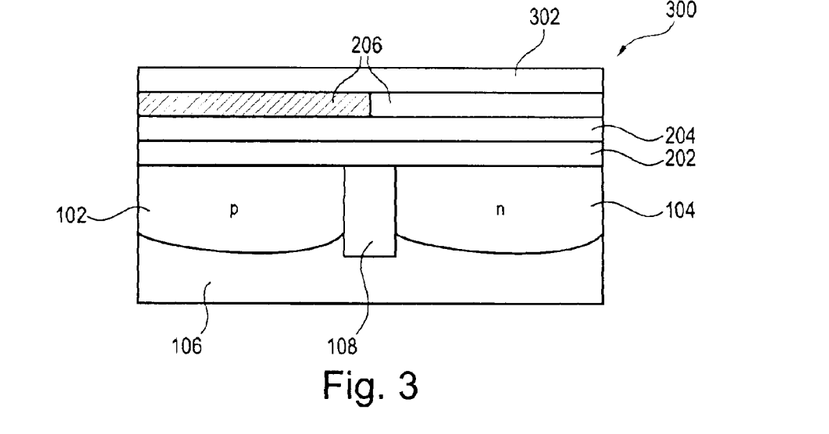

In order to obtain a layer sequence 300 shown in FIG. 3, the first photoresist layer 208 is removed, and a second photoresist layer 302 is deposited conformally.

Figure 4:
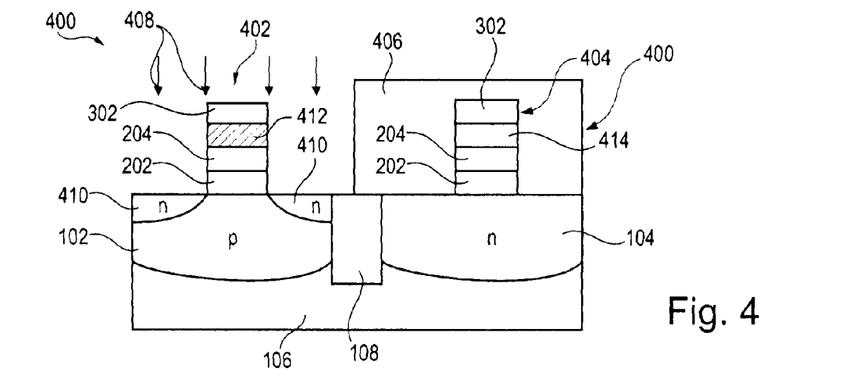

In order to obtain a layer sequence 400 shown in FIG. 4, the second photoresist layer 302 is patterned, and subsequently an etching procedure is carried out to generate a first gate stack 402 above the p-well 102 and a second gate stack 404 above the n-well 104.

After that, a third photoresist layer 406 is deposited and patterned to only cover the second gate stack 404, but not the first gate stack 402. Thereafter, an n-type dopant 408 is implanted into exposed surface portions of the p-well 102, thereby forming source/drain regions 410 for the field effect transistor related to the first gate stack 402.

The patterned metal layer 206 has been structured to form a first ion implanted tungsten gate 412 and a second non-ion implanted tungsten gate 414.

Figure 5:
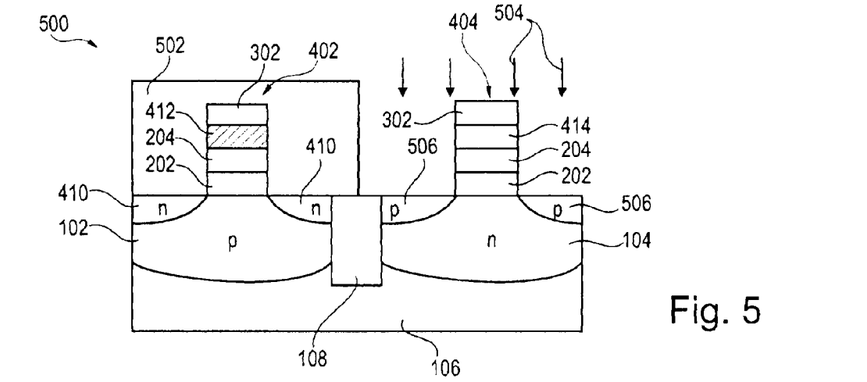

In order to obtain a layer sequence 500 shown in FIG. 5, material of the third photoresist 406 is removed, and a fourth photoresist 502 is deposited and patterned to only cover the first gate stack 402, but not the second gate stack 404. After that, a p-type implantation is performed, compare reference numeral 504 to thereby form source/drain regions 506 for the field effect assigned to the second gate stack 404.

Figure 6:
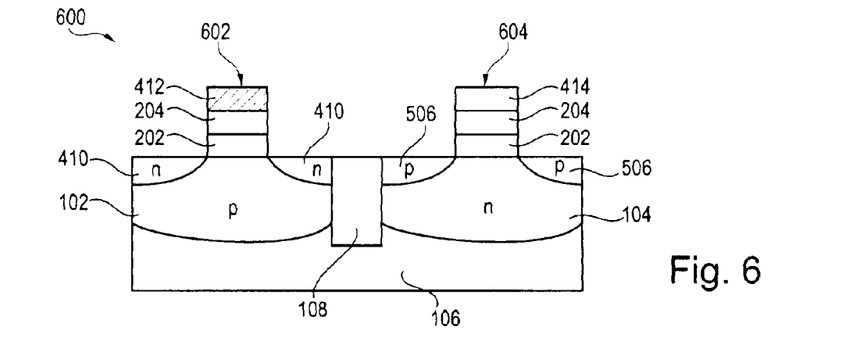

After this procedure, the photoresist portions 502, 302 are removed from the layer sequence 500, to thereby form a CMOS transistor arrangement 600 according to an exemplary embodiment of the invention.

The transistor arrangement 600 shown in FIG. 6 comprises an n-MOSFET 602 and a p-MOSFET 604. By the provision of the dielectric capping layer 204 and by the ion implantation in the gate 412 of the n-MOS 602, the desired transistor characteristics of the n-MOSFET 602 have been adjusted. The transistor characteristics of the p-MOSFET 604 have been adjusted particularly by the design parameters of the dielectric capping layer 204, particularly by its thickness and by its material selection. By taking these measures, it is possible to use the same metal material for both gates 412, 414 of the n-MOSFET 602 and the p-MOSFET 604 and at the same time adjust their work functions such as threshold voltages etc. independently from one another.

In the following, further details regarding a manufacturing procedure of transistor devices according to exemplary embodiments of the invention will be explained.

A manufacturing method according to an exemplary embodiment may be denoted as a single metal single dielectric CMOS integration combined with an additional ion implantation in a portion of a common metal layer forming both gate regions of two complementary transistors.

A single metal such as titan, tantalum, molybdenum or tungsten (see broader list above) may be used for manufacturing the gate regions of complementary transistors. Additionally, a base dielectric may be manufactured from a SiON/SiO.sub.2 or a high-k material. The metal layer may have a thickness of less than 20 nm (typically 2 nm to 15 nm). An optional electrically conductive capping layer of a thickness of, for instance, less than 30 nm, may be formed as well (above or below the gate). It may be made of another metallic material or of (for instance amorphous or crystalline) silicon or any other semiconductor material.

A dielectric capping layer, for instance made of aluminium oxide, may cap on both regions of the complementary device. It may have a thickness of less than 2 nm and it is in contact with the gate oxide dielectric. Optionally, a dielectric annealing procedure may be carried out to intermix different components of such an electrically insulating layer with one another and/or with an adjacent gate insulating layer.

Particularly, an n-MOS region of the CMOS arrangement may be ion implanted with material such as As, Yb, or Y.

However, the n-regions and p-regions of the described transistor arrangement may also be inverted.

Embodiments of the invention may be realized as bulk devices or as fully depleted devices.

Figure 7:
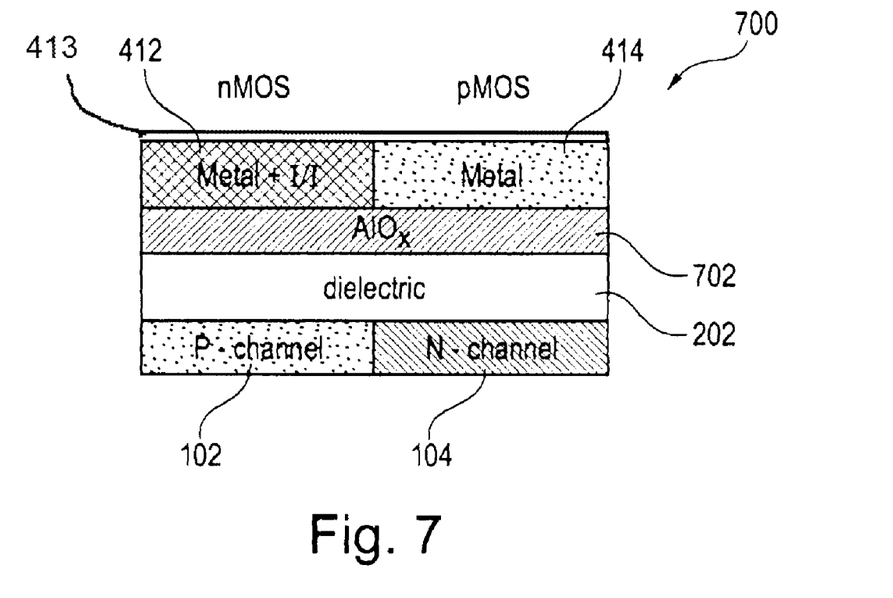
FIG. 7 and FIG. 8 schematically show transistor devices according to exemplary embodiments of the invention.

FIG. 7 shows a schematic layer sequence 700 according to an exemplary embodiment of the invention.

FIG. 7 shows a p-channel 102 and an n-channel 104 on which a dielectric layer 202 as a common gate insulating layer is deposited. A capping layer 702 of FIG. 7 is an aluminium oxide layer. Above the capping layer 702, a first metal gate 412 having an ion implantation is located above the p-channel 102, whereas a second gate region 414 consisting of a metal (but without ion implantation) is deposited above the n-channel 104. Thus, FIG. 7 shows an embodiment with a single common capping layer 702 on an n-MOS portion and on a p-MOS portion.

To manufacture the sequence 700, the dielectric layer 202 and subsequently the aluminium oxide layer 702 are deposited over both channel regions 102, 104. The dielectric stack 202, 702 may be optionally annealed to promote intermixing. The p-channel region 102 may be masked, and an ion implantation may be carried out selectively into the gate 412. Annealing of the dielectric stack is possible before performing an optional silicon deposition or after such a silicon deposition. An annealing of the aluminium oxide layer 702 with the silicon oxide/silicon oxide nitride layer 202 may be advantageous for proper mixing. A capping layer may be used to protect metallic material during mask deposition and removal, such as a thin layer of silicon 413.

Figure 8:
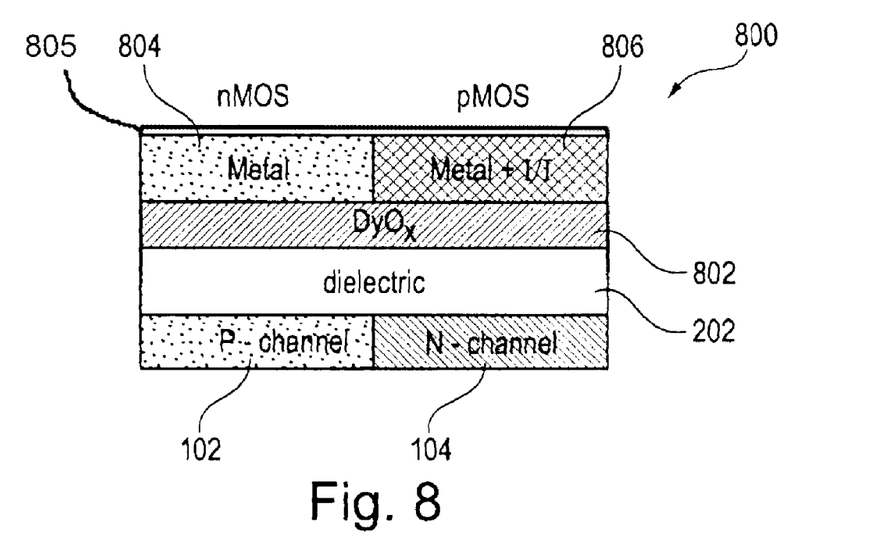

FIG. 8 shows a schematic layer sequence 800 according to another exemplary embodiment of the invention.

In this embodiment, a capping layer 802 made of dysprosium oxide may be formed on the gate insulating layer 202. Furthermore, the metal portion above the n-channel 104 is ion implanted to form the metal gate 806, whereas a metal gate 804 above the p-channel 102 is not ion implanted in this embodiment.

Also the embodiment of FIG. 8 has a single capping layer 802 over an n-MOS region and a p-MOS region. Alternatively, lanthanum oxide, scandium oxide or any other rare earth oxide may be used. The dielectric stack 202, 802 may be optionally annealed (before or after optional silicon deposition on top of the metal 804, 806).

Again, an annealing of dysprosium oxide 802 may be advantageous to mix with silicon oxide nitride/silicon oxide or hafnium oxide material of the dielectric layer 202. A conductive or semiconductive capping layer (not shown) may be used to protect the metal 804, 806 during mask deposition (such as a thin layer of silicon 805).

In an embodiment, a TiN gate may be capped with a silicon cap having a thickness of, for instance, 5 nm to 30 nm. Such a system may be treated by ion implantation and by thermally annealing. This procedure may allow to efficiently tune a work function of a field effect transistor.

For instance, it may be possible to efficiently tune a work function by 150 meV to 200 meV through piling up aluminium at the metal electrode/high-k interface. Thus, it may be advantageous to locate aluminium material at a gate oxide interface. Implanting aluminium at an energy of 4 keV and with a doses of 5 10.sup.15 cm.sup.−2 may result in a significant shift of the threshold voltage of a p-MOS transistor. Increasing the energy and/or increasing the dose may reduce an absolute value of the threshold voltage of a p-MOS transistor. A dose of more than 10.sup.15 cm.sup.−2 may allow to properly adjust the transistor work functions.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A device, comprising:
   a first channel region formed in a first portion of a substrate, the first channel region being doped with a dopant of a first type of conductivity;
   a second channel region formed in a second portion of the substrate, the second channel region being doped with a dopant of a second type of conductivity;
   a gate insulating layer and a dielectric capping layer formed on the first channel region and on the second channel region, the dielectric capping layer comprising a capping layer including at least one of the following: aluminium oxide, rare earth oxide, and hafnium oxide;
   a first metal gate region formed to be spaced with regard to the first channel region by the gate insulating layer and the dielectric capping layer; and
   a second metal gate region formed to be spaced with regard to the second channel region by the gate insulating layer and the dielectric capping layer;
   wherein one of the first metal gate region and the second metal gate region comprises ytterbium ions or yttrium ions, and
   wherein the first metal gate region and the second metal gate region include the same metal selected from the group consisting of titanium, molybdenum, and tungsten.

2. The device of claim 1, wherein the first type of conductivity is complementary to the second type of conductivity.

3. The device of claim 1, wherein the first channel region, a first part of the gate insulating layer, a first part of the dielectric capping layer, and the first metal gate region relate to a first field effect transistor of a first type of conductivity.

4. The device of claim 3, wherein the second channel region, a second part of the gate insulating layer, a second part of the dielectric capping layer, and the second metal gate region relate to a second field effect transistor of a second type of conductivity.

5. The device of claim 1, wherein the capping layer includes hafnium oxide.

6. The device of claim 1, wherein the capping layer is disposed over the gate insulating layer and in contact with the gate insulating layer, wherein the gate insulating layer is a dielectric layer.

7. The device of claim 1, wherein the first metal gate region and the second metal gate region have a thickness of less than 20 nm.

8. The device of claim 1, wherein the capping layer is disposed under the gate insulating layer and in contact with the gate insulating layer, wherein the gate insulating layer is a dielectric layer.

9. The device of claim 1, wherein the other one of the first metal gate region and the second metal gate region comprises ions of a material other than ytterbium and yttrium.

10. The device of claim 1, wherein the other one of the first metal gate region and the second metal gate region is free of implanted ions.

11. The device of claim 10, wherein the one of the first metal gate region and the second metal gate region relates to an n-type field effect transistor.

12. The device of claim 1, wherein a thickness of the dielectric capping layer is less than 2 nm.

13. A method of manufacturing a transistor device, comprising:
   forming a first channel region in a first portion of a substrate;
   forming a second channel region in a second portion of the substrate;
   forming a gate insulating layer including a first material and a dielectric capping layer including a second material on the first channel region and on the second channel region, the second material including at least one of: aluminium oxide, rare earth oxide, tantalum oxide, zirconium oxide, and hafnium oxide;
   performing an annealing process thereby intermixing the first and second materials;
   forming a first metal gate region over the gate insulating layer and the dielectric capping layer over the first channel region; and
   forming a second metal gate region over the gate insulating layer and the dielectric capping layer over the second channel region,
   forming a silicon layer on top of the first metal gate region and the second metal gate region,
   wherein the performing of the annealing process is after the forming of the silicon layer.

14. The method of claim 13, wherein the dielectric capping layer is designed for adjusting a work function of the transistor device.

15. The method of claim 13, wherein the dielectric capping layer is designed for adjusting a threshold voltage of the transistor device.

16. The method of claim 13, further comprising:
   performing an ion implantation to one of the first metal gate region and the second metal gate region, wherein the ion implantation comprises implantation with at least one species selected from the group consisting of arsenic, ytterbium, and yttrium.

17. The method of claim 13, wherein the dielectric capping layer is disposed over the first material and in contact with the first material, wherein the first material is a dielectric material.

18. The method of claim 13, wherein the dielectric capping layer is disposed under the first material and in contact with the first material, wherein the first material is a dielectric material.

19. A device, comprising:
a substrate;
a first channel region formed in a first portion of the substrate and doped with a dopant of a first type of conductivity;
a second channel region formed in a second portion of the substrate and doped with a dopant of a second type of conductivity;
a gate insulating layer and a dielectric capping layer formed on the first channel region and on the second channel region, the dielectric capping layer comprising a capping layer including at least one of rare earth oxide and hafnium oxide;
an n-type gate region formed to be spaced with regard to the first channel region by the gate insulating layer and the dielectric capping layer, the n-type gate region including a metal and ytterbium ions; and
a p-type gate region formed to be spaced with regard to the second channel region by the gate insulating layer and the dielectric capping layer, wherein the p-type gate region includes the metal and is free of the ions,
wherein the metal is selected from the group consisting of titanium, tantalum, molybdenum, and tungsten.

20. The device of claim 19, wherein the material of the gate insulating layer and the material of the dielectric capping layer are intermixed.

* * * * *